United States Patent
Hoon Ha

(10) Patent No.: US 12,240,098 B2
(45) Date of Patent: Mar. 4, 2025

(54) CLEAN ROOM SINGLE-AXIS ROBOT TO WHICH DUST COLLECTION SYSTEM HAVING OPEN STRUCTURE IS APPLIED

(71) Applicant: SP SYSTEMS CO., LTD., Yangsan-si (KR)

(72) Inventor: Jung Hoon Ha, Yangsan-si (KR)

(73) Assignee: SP SYSTEMS CO., LTD., Yangsan-si (KR)

( * ) Notice: Subject to any disclaimer, the term of this patent is extended or adjusted under 35 U.S.C. 154(b) by 0 days.

(21) Appl. No.: 18/452,037

(22) Filed: Aug. 18, 2023

(65) Prior Publication Data

US 2023/0390940 A1    Dec. 7, 2023

Related U.S. Application Data

(63) Continuation of application No. PCT/KR2021/007389, filed on Jun. 14, 2021.

(30) Foreign Application Priority Data

Feb. 18, 2021    (KR) .................... 10-2021-0021507

(51) Int. Cl.
 *B25J 11/00* (2006.01)
 *B25J 9/00* (2006.01)
 *B25J 21/00* (2006.01)

(52) U.S. Cl.
 CPC ......... *B25J 11/0085* (2013.01); *B25J 9/0009* (2013.01); *B25J 21/005* (2013.01)

(58) Field of Classification Search
 CPC ...... F16H 2025/2034; F16H 2025/2031; B25J 21/005

USPC ................................................ 74/89.4, 89.33
See application file for complete search history.

(56) References Cited

U.S. PATENT DOCUMENTS

| | | | | |
|---|---|---|---|---|
| 5,319,990 A | * | 6/1994 | Veale | B23Q 5/404 49/362 |
| 6,344,718 B1 | * | 2/2002 | Nagai | F16H 25/2418 310/80 |
| 2010/0206102 A1 | * | 8/2010 | Aso | F16C 29/082 74/89.4 |
| 2012/0285278 A1 | * | 11/2012 | Sakai | H02K 7/06 74/89.33 |

(Continued)

FOREIGN PATENT DOCUMENTS

| EP | 3929466 A1 * | 12/2021 | ............. F16H 19/06 |
|---|---|---|---|
| JP | 08-216071 A | 8/1996 | |

(Continued)

*Primary Examiner* — Jake Cook
(74) *Attorney, Agent, or Firm* — United One Law Group LLC; Kongsik Kim; Jhongwoo Peck

(57) ABSTRACT

A clean room single-axis robot in which a dust collection system is used includes a transfer unit installed inside a clean room to transfer an assembly part in the forward/backward direction and an elevating unit installed on one side of the transfer unit to transfer an assembly part in the upward/downward direction. The transfer unit includes a horizontal profile, first covers, a first guide unit, a driving belt, a plurality of rollers, and a forward/backward movement unit. A dust collection system of the transfer unit has an open structure, and is configured to suction the air accommodated inside the horizontal profile, collect dust contained in the air, and then discharge the air.

3 Claims, 9 Drawing Sheets

(56) References Cited

U.S. PATENT DOCUMENTS

2016/0025198 A1* 1/2016 Chen ................. F16H 25/20
74/89.33

FOREIGN PATENT DOCUMENTS

| KR | 10-0812988 B1 | 3/2008 |
|----|---------------|--------|
| KR | 10-2011-0130297 A | 12/2011 |
| KR | 10-1672395 B1 | 11/2016 |
| KR | 10-2019-0011106 A | 2/2019 |

* cited by examiner

CLEAN ROOM SINGLE-AXIS ROBOT TO WHICH DUST COLLECTION SYSTEM HAVING OPEN STRUCTURE IS APPLIED

CROSS-REFERENCE TO RELATED APPLICATIONS

This application is a Continuation of International Application No. PCT/KR2021/007389 filed Jul. 14, 2021, which claims priority from Korean Application No. 10-2021-0021507 filed Feb. 18, 2021. The aforementioned applications are incorporated herein by reference in their entireties.

TECHNICAL FIELD

The present disclosure relates to a clean room single-axis robot and, more particularly, to a single-axis robot in which a dust collection system having an open structure is used, wherein the dust collection system has a minimized space open to the outside and is configured to suction, collect, and discharge scattered dust even in the case in which dust is produced within the single-axis robot.

RELATED ART

A clean room single-axis robot or a Cartesian coordinate robot is a device that assembles, for example, semi-manufactured products or parts of semiconductor or flat panel displays (FPDs) by transporting the semi-manufactured products or parts in one direction. Recently, the length of the single-axis robot for assembling FPDs is also increasing with increases in the size of FPDs in order to match the increased reciprocating distance when assembling FPDs.

When a clean room single-axis robot of the related art is operated for a long time, a large amount of dust is produced from a drive belt or a ball screw of a drive unit due to friction in the drive unit. In addition, in the clean room single-axis robot of the related art, when dust is produced from the drive belt or the ball screw, dust particles of 1 μm or less in size may be scattered to the air within the clean room or be accumulated within the clean room single-axis robot or at the bottom of the clean room due to a number of open spaces in the side surfaces of the single-axis robot. Thus, it may be difficult to manage the cleanness of the clean room. Accordingly, maintenance costs for cleaning dust accumulated within the single-axis robot or at the bottom of the clean room may increase, and the yield of the manufacturing process may be reduced.

In addition, in the clean room single-axis robot of the related art, a metal cover including a magnet is additionally provided on the front surface of the single-axis robot in order to prevent the leakage of the dust produced from the inside of the single-axis robot. However, when the single-axis robot is operated for a long time, the metal cover disposed on the front surface of the single-axis robot may be significantly deformed since the metal cover is in contact with the drive unit.

SUMMARY

Accordingly, the present disclosure has been made keeping in mind the above problems occurring in the prior art, and an objective of the present disclosure is to provide a single-axis robot in which a dust collection system having an open structure is used, wherein the dust collection system has a minimized space open to the outside and is configured to suction, collect, and discharge scattered dust even in the case in which dust is produced within the single-axis robot.

Also provided is a clean room single-axis robot in which a dust collection system having an open structure is used, wherein the structure of the dust collection system is designed such that a front cover and a drive unit are spaced apart from each other so as to remove the friction therebetween.

In order to accomplish the above objective, the present disclosure provides a clean room single-axis robot 100 disposed within a clean room in which a dust collection system having an open structure is used. The clean room single-axis robot 100 may include a transfer unit 200 configured to transport components for assembly in forward and backward directions and a lift unit 300 disposed at one side of the transfer unit 200 and configured to transport the components for assembly in a vertical direction. The transfer unit 200 may include: a horizontal profile 210 having a hollow structure with an open upper central portion and elongated in forward and backward directions; first covers 220 disposed on both sides of a top of the horizontal profile 210 to be spaced apart from each other; a first guide 230 screw-engaged with an inner central portion of the horizontal profile 210 to guide a reciprocating part 250; a drive belt 240 elongated in forward and backward directions along the inside of the horizontal profile 210 and to be moved in the forward and backward directions by driving force of a motor; a plurality of rollers 244 disposed on the bottom of the horizontal profile 210 in a rotatable manner to allow the drive belt 240 disposed thereabove to smoothly move; the reciprocating part 250 disposed at one side of the drive belt 240 to be moved in the forward and backward directions by the drive belt 240; and a dust collection system 260 configured to suction air contained in the horizontal profile 210, collect dust contained in the air, and discharge the air.

The reciprocating part 250 may include a first moving block 251 fitted to a portion of a top of the drive belt 240 to move in a transverse direction in conjunction with the drive belt 240. A depressed neck portion 252 may be provided in a central portion of the first moving block 251, the width of the neck portion 252 being smaller than the width of each of an upper portion and a lower portion of the first moving block 251. A first inlet 253, through which air enters from the inside of the clean room, may be provided between the neck portion 252 and the first covers 220. A plurality of holes 211, through which the air containing the dust is discharged from the inside of the horizontal profile 210, may be provided in a bottom of the horizontal profile 210.

The dust collection system 260 may include: an intake part 261 connected to a portion of the horizontal profile 210 and allowing the air contained in the horizontal profile 210 to be suctioned therethrough; a dust collection part 262 connected to the intake part 261 to suction the air and collect the dust contained in the air; and a discharge part 263 connected to the dust collection part 262, and through which the air that has passed through the dust collection part 262 is discharged. A plurality of intake holes 261a, through which the air contained in the horizontal profile 210 is suctioned, may be provided in one end of the intake part 261. The dust collection part 262 may include: an intake fan 262a configured to suction the air; and a filter 262b configured to collect the dust contained in the air suctioned by the intake fan 262a.

The lift unit 300 may include: a hollow vertical profile 310 having a structure with an open upper central portion and elongated in a longitudinal direction; second covers 320 disposed on both sides of a top of the vertical profile 310 to be spaced apart from each other; a plate 325 screw-engaged with a portion of the vertical profile 310; second guides 330 screw-engaged with right and left portions of the top of the vertical profile 310; a ball screw 340 disposed above a central portion of the vertical profile 310 to be rotated by driving force of the motor; an up-down movement unit 350 configured to be linearly moved by the ball screw 340; and a dust collection system 260 configured to suction the air contained in the vertical profile 310, collect the dust contained in the air, and discharge the air. The up-down movement unit 350 may include: a second moving block 351 screw-engaged with a top of the ball screw 340 to be linearly moved by the ball screw 340; second guide blocks 352 disposed on both sides of a bottom of the second moving block 351 to move along the second guides 330 in conjunction with the second moving block 351; and second movers 353 disposed on a top of the second moving block 351 to move in conjunction with the second moving block 351.

A second inlet 321, through which the air enters the vertical profile 310, may be provided between the second covers 320 and the second covers 320 adjacent to the second covers 320. A discharge hole 311, through which the air containing the dust is discharged from the inside of the vertical profile 310, may be provided in a bottom of the vertical profile 310.

A plurality of slots 327 may be provided in the plate 325. A plurality of fastening holes 362 corresponding to the slots 327 may be provided in one side of the lower block 361. A position at which the lower block 361 is fastened to the plate 325 may be adjustable in a single direction or a direction opposite the single direction along a centerline of the slots 327.

An upper block 363, the size of which is the same as that of the lower block 361, may be screw-engaged with a top surface of the lower block 361. A top cover 360 may be located between and screw-engaged with the lower block 361 and the upper block 363 and be disposed above the second covers 320.

In the room single-axis robot in which a dust collection system having an open structure is used according to the present disclosure, the dust collection system has the minimized space open to the outside and is configured to suction, collect, and discharge scattered dust even in the case in which dust is produced within the single-axis robot. Accordingly, the cleanness of the clean room and the single-axis robot may be easily managed.

In addition, in the room single-axis robot in which a dust collection system having an open structure is used according to the present disclosure, maintenance costs for cleaning dust accumulated within the single-axis robot or at the bottom of the clean room may be reduced, and thus the efficiency, stability, and yield of production may be improved.

Furthermore, in the room single-axis robot in which a dust collection system having an open structure is used according to the present disclosure, the dust collection system may be easily replaced or repaired, and thus the convenience of maintenance may be improved.

In addition, in the room single-axis robot in which a dust collection system having an open structure is used according to the present disclosure, the first covers and the drive belt are spaced apart from each other and the second covers and the ball screw are spaced apart from each other, and thus there is no friction between the first covers and the drive belt or between the second covers and the ball screw. Even in the case in which the single-axis robot is driven for a long time, the second covers and the first covers are not deformed.

DETAILED DESCRIPTION

Hereinafter, embodiments of the present disclosure will be described in detail with reference to the accompanying drawings so that those skilled in the art to which the present disclosure pertains could easily put the present disclosure into practice.

However, the following embodiments are merely examples provided for a better understanding of the present disclosure and the scope of protection of the present disclosure shall not be restricted or limited. In addition, it should be understood that the present disclosure may be realized in various forms and are not limited to the embodiments described herein.

Figure 1:
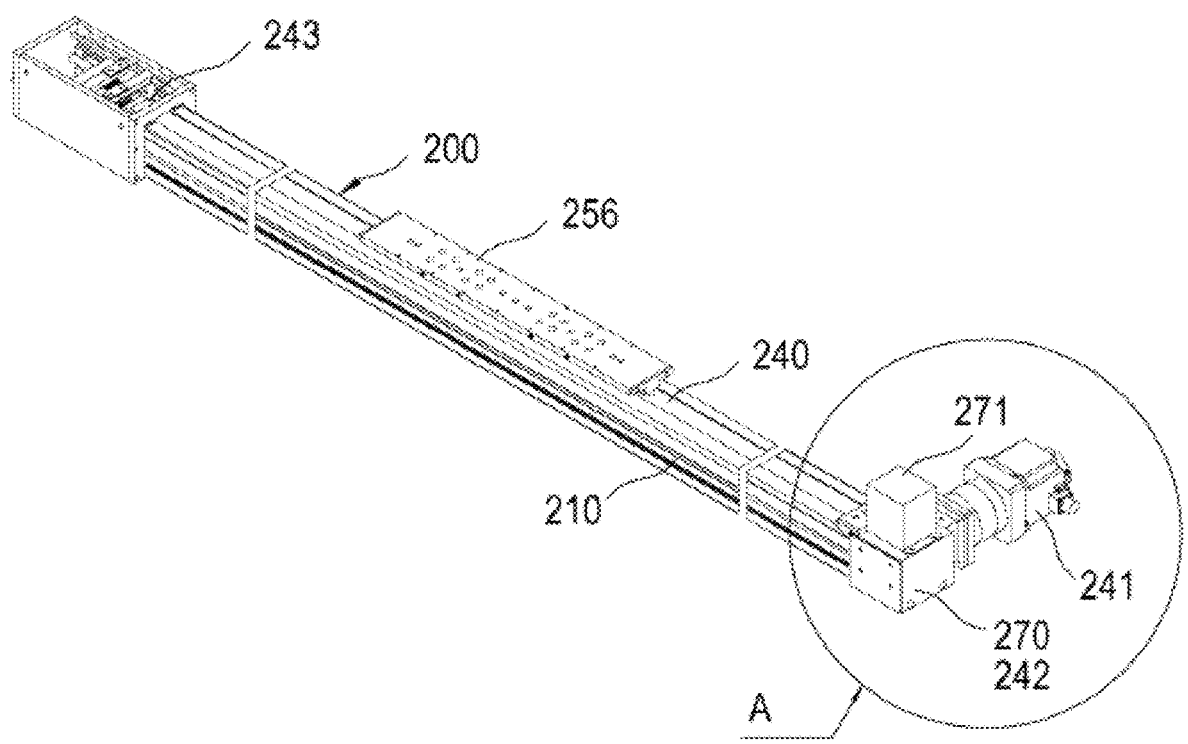
FIG. 1 is a perspective view illustrating a transfer unit of a room single-axis robot in which a dust collection system having an open structure is used according to the present disclosure.
Figure 2:
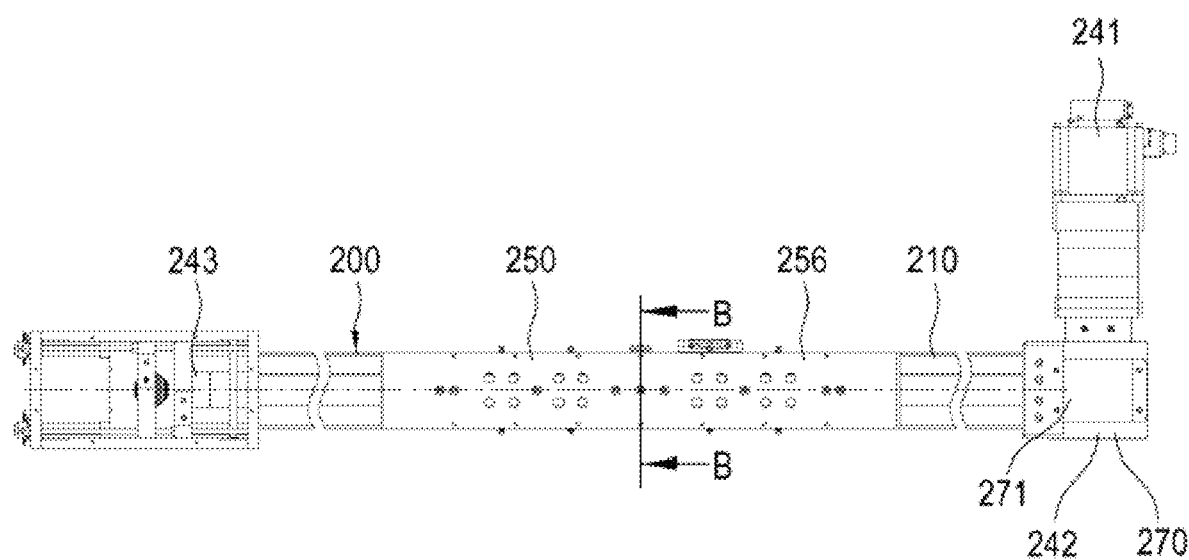
FIG. 2 is a plan view of the transfer unit illustrated in FIG. 1.

FIG. 1 is a perspective view illustrating a transfer unit 200 of a room single-axis robot 100 in which a dust collection system having an open structure is used according to the present disclosure, and FIG. 2 is a plan view of the transfer unit 200 illustrated in FIG. 1.

Figure 3:
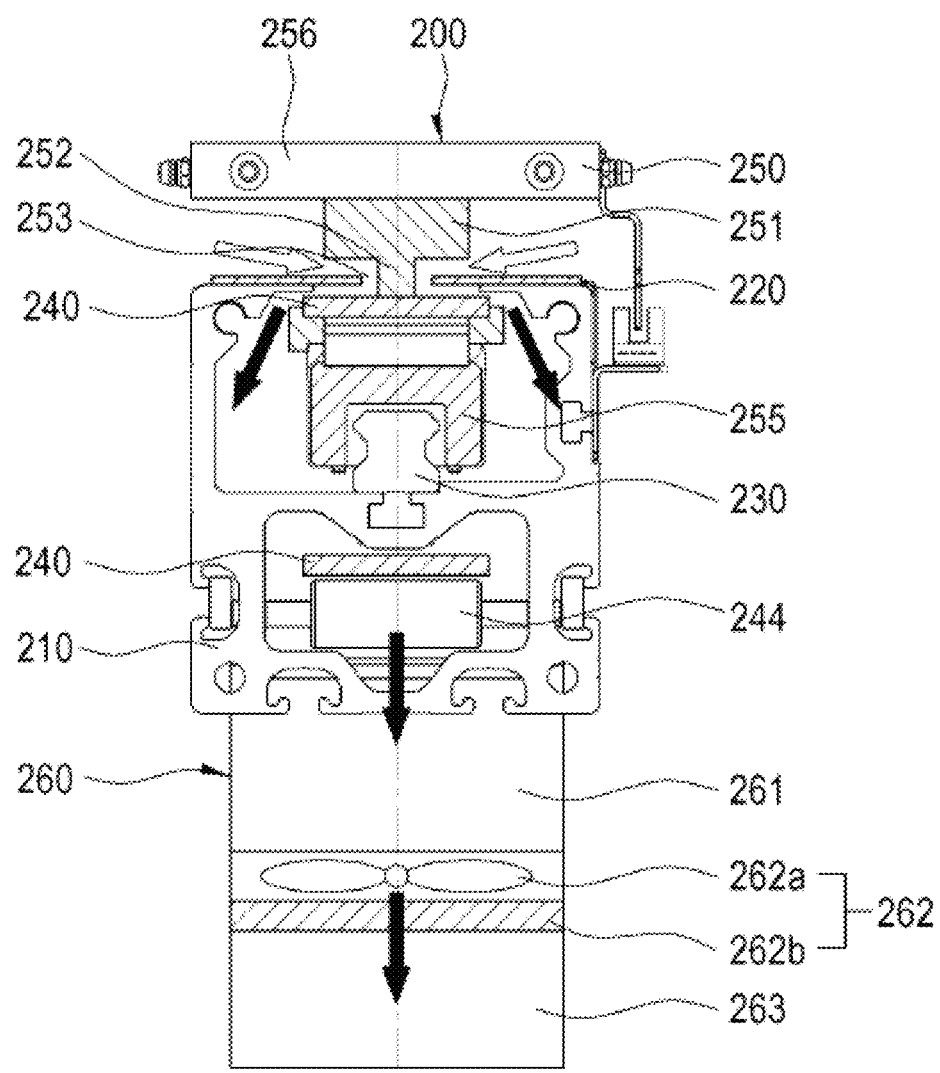
FIG. 3 is a cross-sectional view of the transfer unit illustrated in FIG. 2 taken along line BB.
Figure 4:
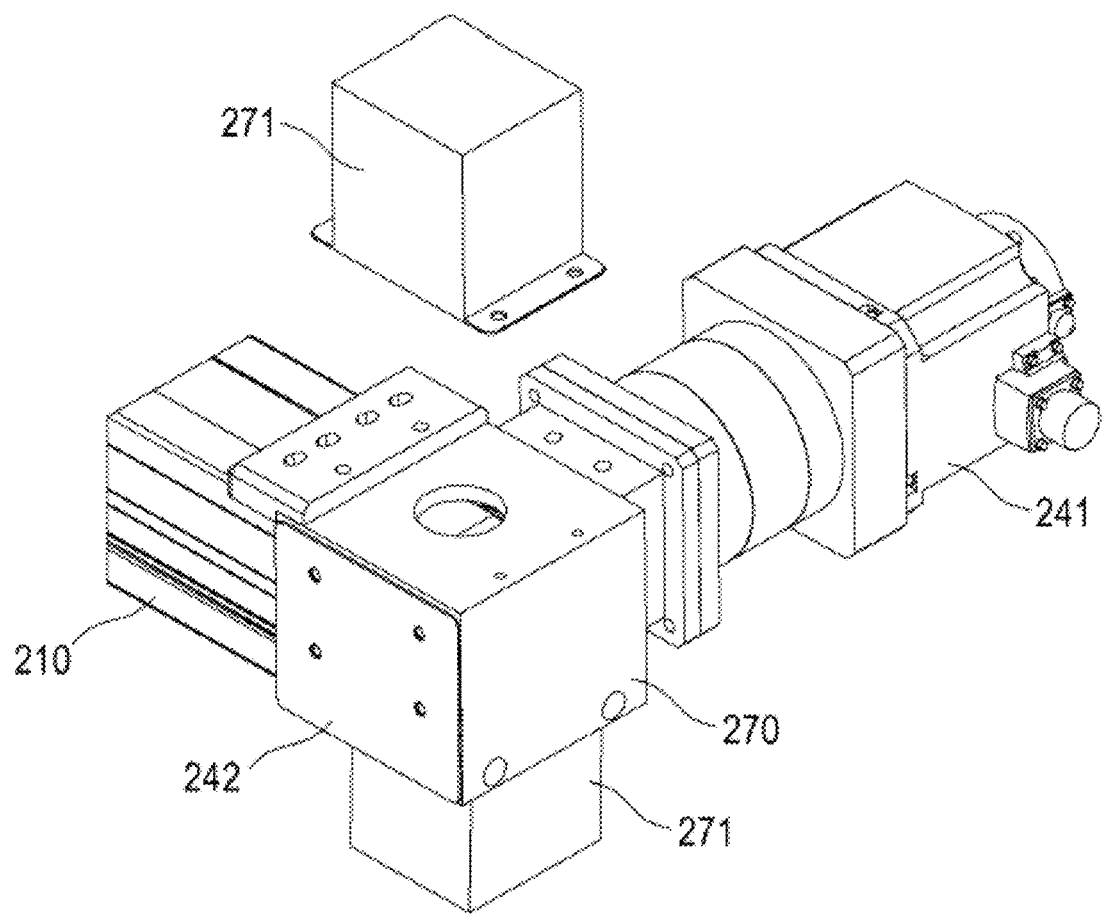
FIG. 4 is a detailed view of part A illustrated in FIG. 1.

FIG. 3 is a cross-sectional view of the transfer unit 200 illustrated in FIG. 2 taken along line BB, and FIG. 4 is a detailed view of part A illustrated in FIG. 1.

Figure 5:
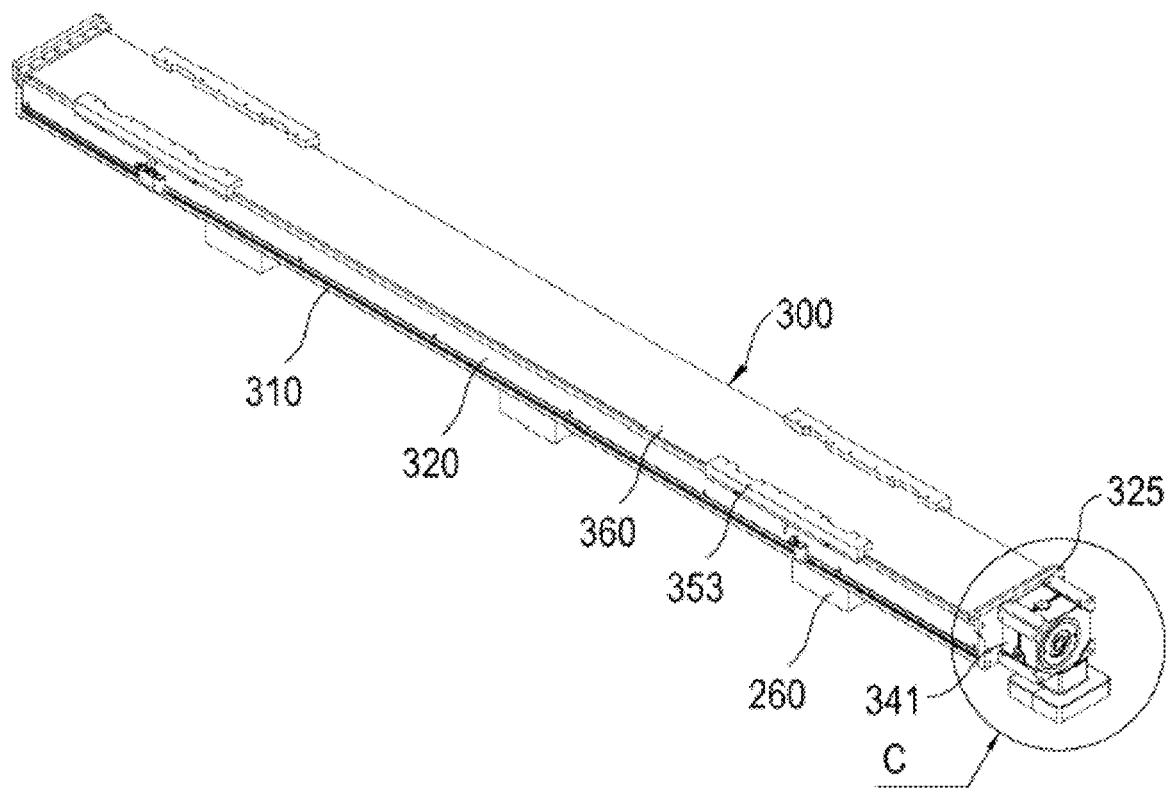
FIG. 5 is a perspective view illustrating the lift unit of the room single-axis robot in which a dust collection system having an open structure is used according to the present disclosure.
Figure 6:
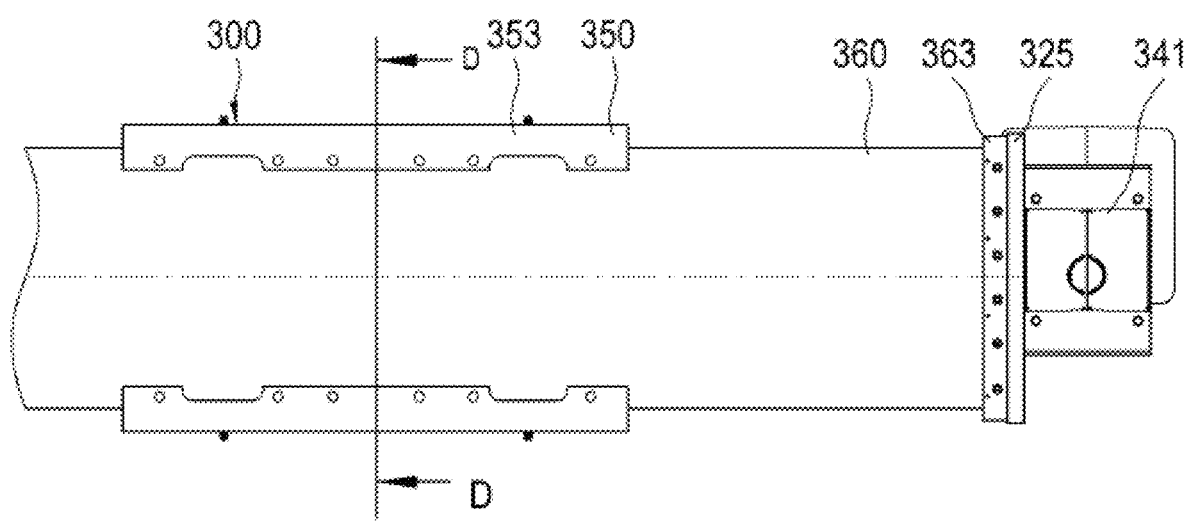
FIG. 6 is a plan view of the lift unit illustrated in FIG. 5.

FIG. 5 is a perspective view illustrating a lift unit 300 of the room single-axis robot in which a dust collection system having an open structure is used according to the present disclosure, and FIG. 6 is a plan view of the lift unit 300 illustrated in FIG. 5.

Figure 7:
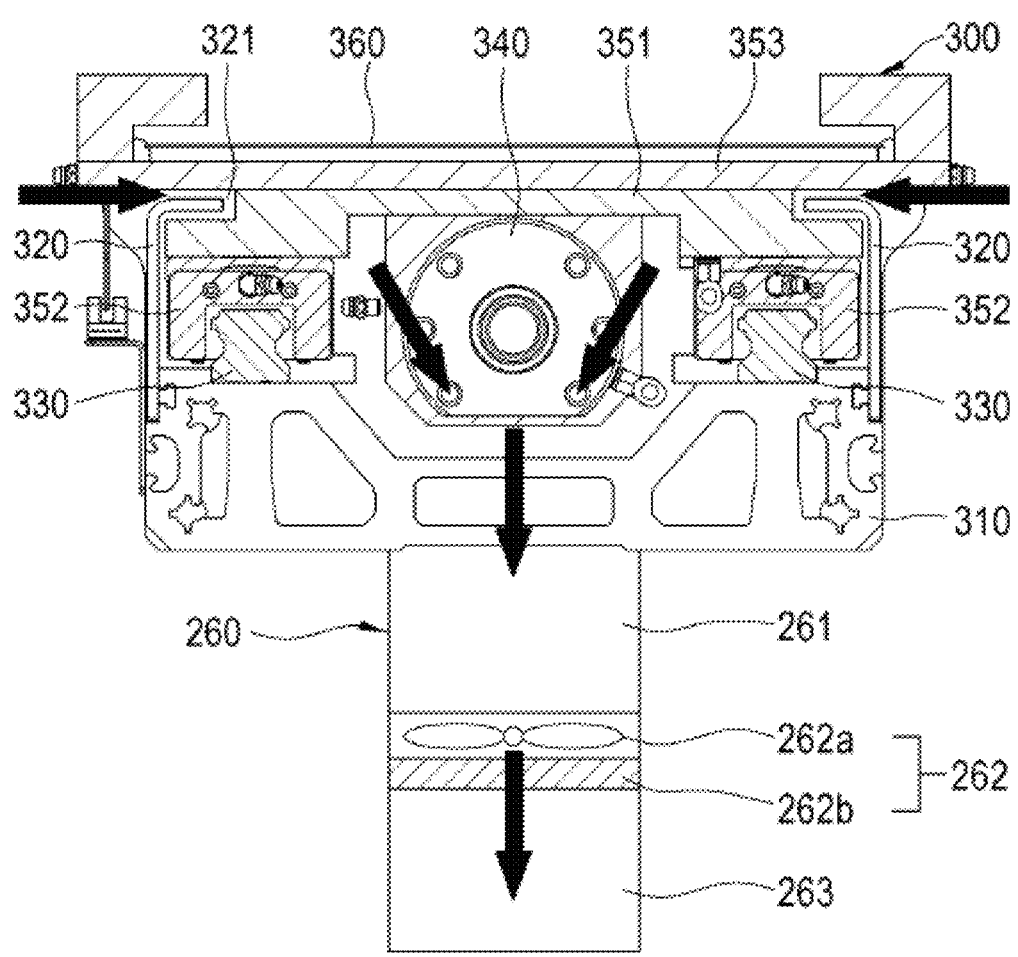
FIG. 7 is a cross-sectional view of the lift unit illustrated in FIG. 6 taken along line DD.
Figure 8:
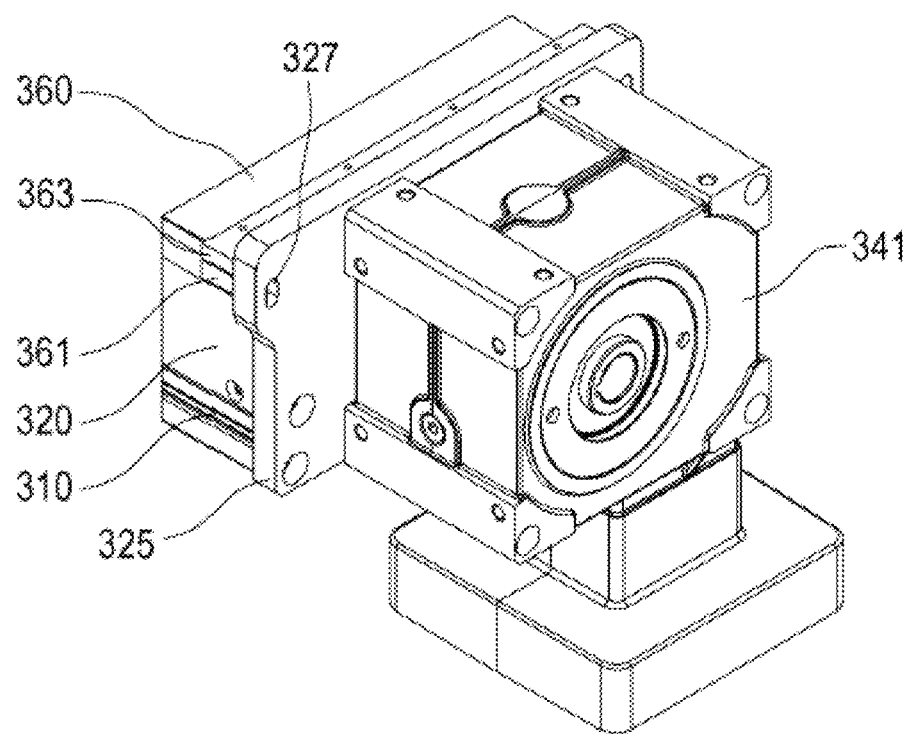
FIG. 8 is a detailed view of part C illustrated in FIG. 5.
Figure 9:
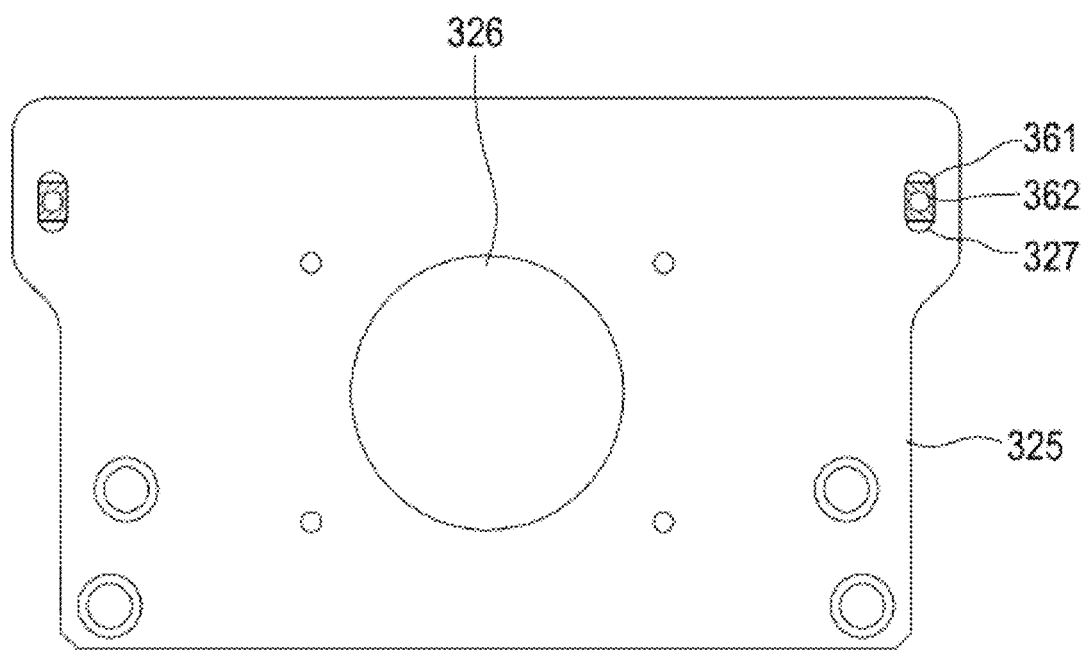
FIG. 9 is a view illustrating the coupling relationship between the plate and the lower block.

FIG. 7 is a cross-sectional view of the lift unit 300 illustrated in FIG. 6 taken along line DD, FIG. 8 is a detailed view of part C illustrated in FIG. 5, and FIG. 9 is a view illustrating the coupling relationship between a plate 325 and a lower block 361.

Referring to FIGS. 1 to 5, the room single-axis robot 100 in which a dust collection system having an open structure is used according to the present disclosure includes the transfer unit 200 and the lift unit 300.

First, the transfer unit 200 is a device disposed within the clean room to transport components for assembly in the forward and backward directions.

In addition, the lift unit 300 is a device disposed at one side of the transfer unit 200 to transport components for assembly in the vertical direction.

Referring to FIGS. 1 to 3, the transfer unit 200 includes a horizontal profile 210, first covers 220, a first guide 230, a drive belt 240, rollers 244, a reciprocating part 250, and a dust collection system 260.

First, the horizontal profile 210 has a hollow structure with an open upper central portion and elongated in the forward and backward directions. Here, the horizontal profile 210 is made of an aluminum (Al) material.

In addition, the first covers 220 are disposed on both sides of the top of the horizontal profile 210 and are spaced apart from each other. Here, each of the first covers 220 has the shape of a plate elongated in the forward and backward directions.

In addition, the first guide 230 is screw-engaged with the inner central portion of the horizontal profile 210 and configured to guide a first guide block 255 of the reciprocating part 250. Here, the first guide 230 is elongated in the forward and backward directions.

In addition, the drive belt 240 is elongated in the forward and backward directions along the inside of the horizontal profile 210 and connected to a drive pulley 242 and a driven pulley 243 to be moved in one direction by driving force of a first drive motor 241.

In addition, the drive pulley 242 is disposed in front of the horizontal profile 210 to be rotated in one direction by the first drive motor 241, while the driven pulley 243 is disposed behind the horizontal profile 210 to be rotated in one direction by the drive belt 240.

Referring to FIG. 4, the drive pulley 242 is disposed inside a pulley box 270, and a ventilation fan 271 may be separately disposed on the top or the bottom of the pulley box 270.

In addition, a plurality of rollers 244 is disposed on the bottom of the horizontal profile 210 so as to be rotatable in position, thereby allowing the drive belt 240 disposed on the top of the rollers 244 to smoothly move. Specifically, each of the rollers 244 may rotate in position with the outer surface thereof being in surface contact with the bottom surface of the drive belt 240.

In addition, the reciprocating part 250 is disposed at one side of the drive belt 240 to be moved in the forward and backward directions by the drive belt 240. The reciprocating part 250 includes a first moving block 251, the first guide block 255, and a first mover 256.

First, the first moving block 251 is fitted to a portion of the top of the drive belt 240 to move in the transverse direction in conjunction with the drive belt 240.

In addition, a depressed neck portion 252 is provided in the central portion of the first moving block 251. The width of the neck portion 252 is smaller than the width of each of the upper portion and the lower portion of the first moving block 251. In addition, the neck portion 252 is disposed between the first covers 220 disposed on both sides of the top of the horizontal profile 210. In addition, a first inlet 253, through which air enters the horizontal profile 210, is provided between the neck portion 252 and the first covers 220.

In addition, a plurality of holes 211 (not shown), through which air containing a large amount of dust is discharged from the inside of the horizontal profile 210, is formed in the bottom of the horizontal profile 210.

In addition, the first guide block 255 is provided on the bottom of the first moving block 251 to move in the transverse direction along the first guide 230 in conjunction with the first moving block 251.

In addition, the first mover 256 is disposed on the top of the first moving block 251 to move in the transverse direction in conjunction with the first moving block 251. The components for assembly are loaded on the first moving block 251, which may transport the components for assembly in the forward and backward directions.

Dust is produced within the horizontal profile 210 due to the friction between the drive belt 240 and the rollers 244 and between the first guide block 255 and the first guide 230. Thus, air contained in the horizontal profile 210 by passing through the first inlet 253 is mixed with the dust.

In addition, the dust collection system 260 has an open structure, and serves to suction air contained in the horizontal profile 210, collect the dust contained in the air, and discharge the air.

The dust collection system 260 includes an intake part 261, a dust collection part 262, and a discharge part 263.

First, the intake part 261 is a path connected to a portion of the horizontal profile 210 and allowing the air contained in the horizontal profile 210 to be suctioned therethrough. Here, a plurality of intake holes 261a (not shown), through which the air contained in the horizontal profile 210 is suctioned, is formed in one end of the intake part 261.

In addition, the dust collection part 262 is connected to the intake part 261 to suction the air and collect the dust contained in the air.

The dust collection part 262 includes an intake fan 262a configured to suction the air and a filter 262b configured to collect the dust contained in the air suctioned by the intake fan 262a. Here, a plurality of holes 264 (not shown) is formed in the top of the filter 262b, with the diameter of the holes being smaller than the diameter of the dust.

The discharge part 263 is a path connected to the dust collection part 262, and through which the air that has passed through the dust collection part 262 is discharged.

Referring to FIGS. 5 to 7, the lift unit 300 includes a vertical profile 310, second covers 320, the plate 325, second guides 330, a ball screw 340, an up-down movement unit 350, and the dust collection system 260.

In addition, the lift unit 300 is a device disposed at one side of the transfer unit 200 to transport the components for assembly in the vertical direction. First, the vertical profile 310 is a hollow structure with the open upper central portion and elongated in the longitudinal direction. Here, the vertical profile 310 is made of an Al material.

The second covers 320 are disposed on both sides of the top of the vertical profile 310 and are spaced apart from each other. Here, each of the second covers 320 is implemented using an angled pipe having the shape of diagonally-mirrored L (or the Korean letter "ㄱ").

In addition, the plate 325 is screw-engaged with a portion of the vertical profile 310. In addition, a through-hole 326 is formed in the central portion of the plate 325. The plate 325 is implemented as a flat plate having a predetermined thickness.

In addition, the second guides 330 are screw-engaged with the right and left portions of the top of the vertical profile 310 to serve to guide second guide blocks 352 of the up-down movement unit 350. Here, the second guide blocks 352 are elongated in the longitudinal direction.

In addition, the ball screw 340 is disposed above the vertical profile 310 to be rotated in a single direction or a direction opposite to the single direction by a second drive motor 341. In addition, the ball screw 340 is connected to the second drive motor 341 through the through-hole 326 of the plate 325.

In addition, the up-down movement unit 350 is disposed above the vertical profile 310 to be linearly moved by the ball screw 340. The up-down movement unit 350 includes a second moving block 351, the second guide blocks 352, and second movers 353.

First, the second moving block 351 is screw-engaged with the top of the ball screw 340 to be linearly moved by the ball screw 340.

In addition, the second guide blocks 352 are disposed on both sides of the bottom of the second moving block 351 to move along the second guides 330 in conjunction with the second moving block 351.

Furthermore, the second movers 353 are disposed on the top of the second moving block 351 to move in conjunction with the second moving block 351. The components for assembly are loaded on the second moving block 351, which may transport the components for assembly.

In addition, a second inlet 321, through which air enters the vertical profile 310, is provided between the second covers 320 provided on both sides of the top of the vertical profile 310.

In addition, an elliptical discharge hole 311 (not shown), through which the air containing the dust is discharged from the inside of the vertical profile 310, is formed in the bottom of the vertical profile 310.

Referring to FIGS. 8 and 9, the lower block 361 is screw-engaged with one surface of the plate 325, and an upper block 363 is screw-engaged with the top surface of the lower block 361.

In addition, a top cover 360 is disposed above the second covers 320 to be located between and coupled to the lower block 361 and the upper block 363 and to extend in the longitudinal direction.

A plurality of slots 327 is formed in the plate 325, and fastening holes 362 corresponding to the slots 327 are formed in one side of the lower block 361. When the lower block 361 is screw-engaged with the plate 325, the fastening position of the lower block 361 may be adjusted. Specifically, the fastening position of the lower block 361 may be adjusted in a single direction or a direction opposite the single direction along the centerline of the slots 327 of the plate 325. In this manner, the distances between the top cover 360 and the second covers 320 may be adjusted so that the top cover 360 does not interfere with the second covers 320.

Thus, the lift unit 300 has an open structure such that the inside thereof is not blocked from the outside by the top cover 360.

In addition, the dust is produced within the vertical profile 310 due to the friction among the ball screw 340, the second guide blocks 352, and the second guides 330. Thus, the air contained in the vertical profile 310 by passing through the second inlet 321 is mixed with the dust.

In addition, the dust collection system 260 has the open structure to suction the air contained in the vertical profile 310, collects the dust contained in the air, and discharges the air.

The dust collection system 260 may be implemented as individual dust collection systems 260 provided on the horizontal profile 210 and the vertical profile 310, respectively, or as a centralized dust collection system 260 in which paths connected to the horizontal profile 210 and the vertical profile 310, respectively, are connected to a single dust collection system 260.

Here, the configuration and operation of the dust collection system 260 of the lift unit 300 are similar to those of the dust collection system 260 of the transfer unit 200, and thus a detailed description thereof will be omitted.

In the room single-axis robot 100 in which a dust collection system having an open structure is used according to the present disclosure, the dust collection system has the minimized space open to the outside and is configured to suction, collect, and discharge scattered dust even in the case in which dust is produced within the single-axis robot. Accordingly, the cleanness of the clean room and the single-axis robot 100 may be easily managed.

In addition, in the room single-axis robot 100 in which a dust collection system having an open structure is used according to the present disclosure, maintenance costs for cleaning dust accumulated within the single-axis robot 100 or at the bottom of the clean room may be reduced, and thus the efficiency, stability, and yield of production may be improved.

Furthermore, in the room single-axis robot 100 in which a dust collection system having an open structure is used according to the present disclosure, the dust collection system 260 may be easily replaced or repaired, and thus the convenience of maintenance may be improved.

In addition, in the room single-axis robot 100 in which a dust collection system having an open structure is used according to the present disclosure, the first covers 220 and the drive belt 240 are spaced apart from each other and the second covers 320 and the ball screw 340 are spaced apart from each other, and thus there is no friction between the first covers 220 and the drive belt 240 or between the second covers 320 and the ball screw 340. Even in the case in which the single-axis robot 100 is driven for a long time, the second covers 320 and the first covers 220 are not deformed.

As set forth above, the main technical idea of the present disclosure is to provide the clean room single-axis robot 100 in which a dust collection system having an open structure. The foregoing embodiment described with reference to the drawings is merely an example. The true scope of protection of the present disclosure shall be defined by the Claims and may be applied to a variety of equivalent embodiments.

DESCRIPTION OF THE REFERENCE NUMERALS IN THE DRAWINGS

100: dust collection system in which a clean room single-axis robot having an open structure is used
200: transfer unit
210: horizontal profile
211: open area
220: first cover
230: first guide
240: drive belt
241: first drive motor
242: drive pulley
243: driven pulley
244: roller
250: reciprocating part
251: first moving block
252: neck portion
253: first inlet
255: first guide block
256: first mover
260: dust collection system
261: intake part
261a: intake hole
262: dust collection part
262a: intake fan
262b: filter
263: discharge part
264: through-hole 270: pulley box
271: ventilation fan
300: lift unit
310: vertical profile
311: discharge hole
320: second cover
321: second inlet
325: plate
326: through-hole
327: slot
330: second guide
340: ball screw
341: second drive motor
350: up-down movement unit
351: second moving block
352: second guide block
353: second mover
360: top cover
361: lower block
362: fastening hole
363: upper block

The invention claimed is:

1. A clean room single-axis robot in which a dust collection system having an open structure is used, the clean room single-axis robot being disposed within a clean room and comprising a transfer unit configured to transport components for assembly in forward and backward directions, wherein the transfer unit comprises:
   a horizontal profile having a hollow structure with an open upper central portion and elongated in the forward and backward directions;
   first covers disposed on both sides of a top of the horizontal profile to be spaced apart from each other;
   a first guide screw-engaged with an inner central portion of the horizontal profile to guide a reciprocating part;
   a drive belt elongated in the forward and backward directions along the inside of the horizontal profile and to be moved in the forward and backward directions by driving force of a motor;
   a plurality of rollers disposed on the bottom of the horizontal profile in a rotatable manner to allow the drive belt disposed thereabove to smoothly move;
   the reciprocating part disposed at one side of the drive belt to be moved in the forward and backward directions by the drive belt; and
   a dust collection system configured to suction air contained in the horizontal profile, collect dust contained in the air, and discharge the air.

2. The clean room single-axis robot of claim 1, wherein the reciprocating part comprises a first moving block fitted to a portion of a top of the drive belt to move in a transverse direction in conjunction with the drive belt,
   a depressed neck portion is provided in a central portion of the first moving block, the width of the neck portion being smaller than the width of each of an upper portion and a lower portion of the first moving block,
   a first inlet, through which air enters from the inside of the clean room, is provided between the neck portion and the first covers, and
   a plurality of holes, through which the air containing the dust is discharged from the inside of the horizontal profile, is provided in a bottom of the horizontal profile.

3. The clean room single-axis robot of claim 1, wherein the dust collection system comprises:
   an intake part connected to a portion of the horizontal profile and allowing the air contained in the horizontal profile to be suctioned therethrough;
   a dust collection part connected to the intake part to suction the air and collect the dust contained in the air; and
   a discharge part connected to the dust collection part, and through which the air that has passed through the dust collection part is discharged,
   wherein a plurality of intake holes, through which the air contained in the horizontal profile is suctioned, is provided in one end of the intake part, and
   wherein the dust collection part comprises:
      an intake fan configured to suction the air; and
      a filter configured to collect the dust contained in the air suctioned by the intake fan.

* * * * *